United States Patent [19]

Wada et al.

[11] Patent Number: 4,896,299
[45] Date of Patent: Jan. 23, 1990

[54] STATIC SEMICONDUCTOR MEMORY DEVICE HAVING FUNCTION OF RESETTING STORED DATA

[75] Inventors: Tomohisa Wada; Toshihiko Hirose, both of Hyogo, Japan

[73] Assignee: Mitsubishi Denki Kabushiki Kaisha, Tokyo, Japan

[21] Appl. No.: 114,245

[22] Filed: Oct. 26, 1987

[30] Foreign Application Priority Data

Oct. 24, 1986 [JP] Japan ................................. 61-254482

[51] Int. Cl.$^4$ ............................................. G11C 7/00
[52] U.S. Cl. .................................. 365/189.01; 365/154
[58] Field of Search ............... 365/154, 189, 190, 205, 365/218, 189.01

[56] References Cited

FOREIGN PATENT DOCUMENTS

105757 6/1982 Japan .
217590 10/1985 Japan .

Primary Examiner—James W. Moffitt
Attorney, Agent, or Firm—Lowe, Price, LeBlanc, Becker & Shur

[57] ABSTRACT

A static semiconductor memory device comprises a plurality of memory cells each connected to complementary bit line pairs and to word lines, a row decoder for selecting any of the word lines, and a load and a transfer gate connected to the bit line pairs. When data "0" or "1" is written into all of the memory cells, the load is cut off from the bit lines by a current cutoff circuit, the bit lines are fixed to a predetermined potential by a current fixing circuit, and all of the word lines are driven by a word line driving circuit, so that all of the memory cells simultaneously enter a common state.

15 Claims, 6 Drawing Sheets

STATIC SEMICONDUCTOR MEMORY DEVICE HAVING FUNCTION OF RESETTING STORED DATA

BACKGROUND OF THE INVENTION

1. Field of the Invention

The present invention relates to a static semiconductor memory device. More particularly, the present invention relates to a static semiconductor memory device comprising a plurality of static memory cells connected to a plurality of complementary bit line pairs and to a plurality of word lines, for collectively writing data into each of the memory cells.

2. Description of the Prior Art

Figure 1:
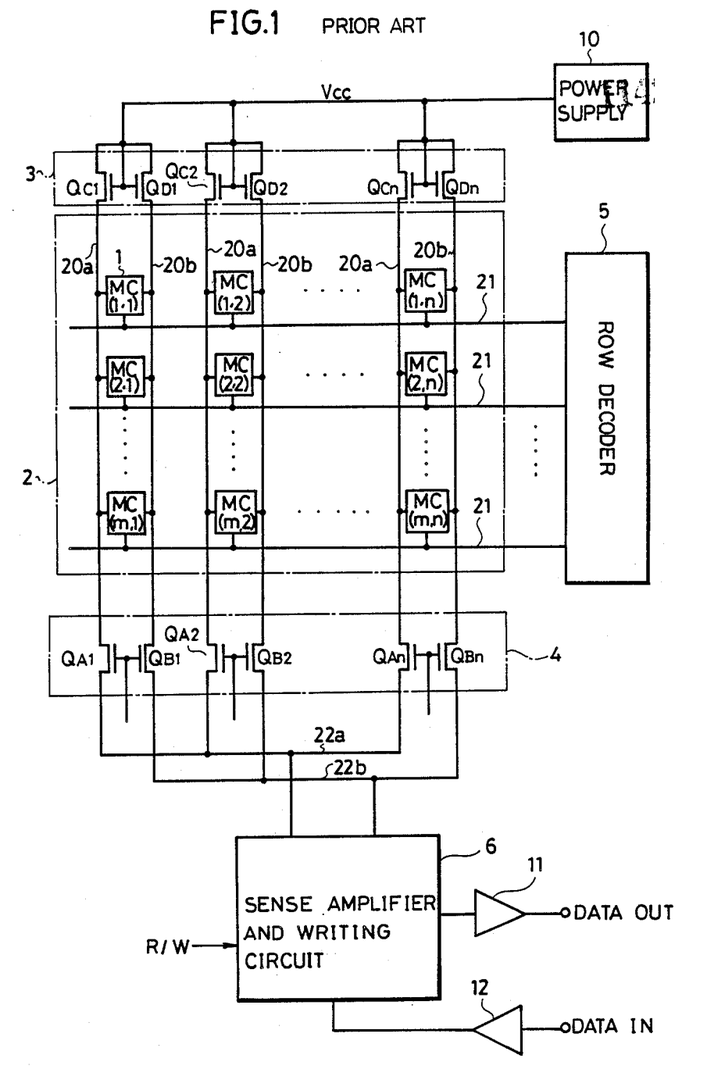
FIG. 1 is a block diagram showing a structure of a conventional static semiconductor memory device.

FIG. 1 is a block diagram showing a conventional static semiconductor memory device.

Referring now to FIG. 1, description is made on a structure of the conventional static semiconductor memory device. In FIG. 1, a memory cell array 2 comprises a plurality of memory cells 1 which are arranged in a matrix. In FIG. 1, the respective memory cells are indicated by symbols MC(1, 1), . . . , MC(m, n). A bit line load circuit 3 is connected between one ends of complementary bit line pairs 20a and 20b and a power supply 10. The bit line load circuit 3 comprises MOSFETs (Metal Oxide Semiconductor Field Effect Transistors) $Q_{C1}, Q_{C2}, \ldots, Q_{Cn}$ and $Q_{D1}, Q_{D2}, \ldots, Q_{Dn}$. A transfer gate 4 is connected to the other ends of the bit lines pairs 20a and 20b. The transfer gate 4 comprises MOSFETs $Q_{A1}, Q_{A2}, \ldots, Q_{An}$ and $Q_{B1}, Q_{B2}, \ldots, Q_{Bn}$. I/O lines 22a and 22b are connected between the transfer gate 4 and a sense amplifier and writing circuit 6, respectively. Buffers 11 and 12 are connected to the sense amplifier and writing circuit 6, so that data is outputted through the buffer 11 and data is inputted externally through the buffer 12. Word lines 21 are connected to a row decoder 5, which selects any of the word lines.

Figure 2:
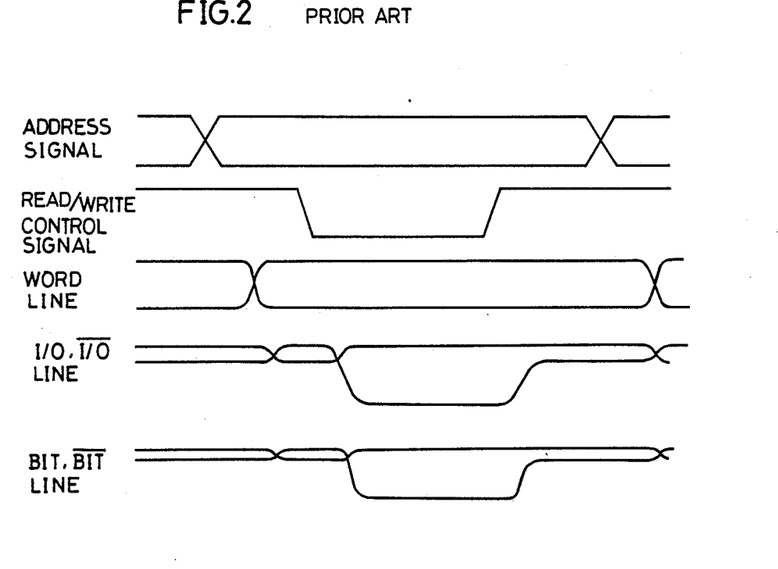
FIG. 2 is a timing chart for explaining a write cycle in the conventional static semiconductor memory device shown in FIG. 1.
Figure 3:
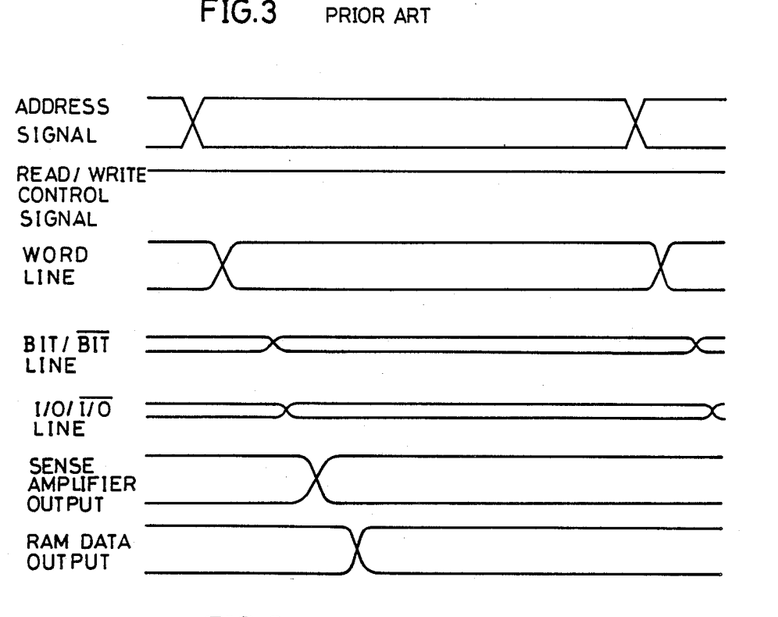
FIG. 3 is a timing chart for explaining a read cycle in the conventional static semiconductor memory device shown in FIG. 1.

FIG. 2 is a timing chart showing a write cycle of the static semiconductor memory device having shown in FIG. 1, and FIG. 3 is also a timing chart for explaining a read cycle.

Referring now to FIGS. 1 to 3, description is made on write and read operation of the conventional static semiconductor memory device. In the write cycle shown in FIG. 2, an address signal is applied to the row decoder 5, so that any of the word lines 21 is set to an "H" level. In addition, the transfer gate 4 selects a particular one pair of bit lines 20a and 20b and connects the pair of bit lines 20a and 20b to the I/O lines 22a and 22b. Therefore, the memory cells are driven by the sense amplifier and writing circuit 6. When a read/write control signal is at an "L" level, data is written into the memory cells. The data to be written into the memory cell 1 is not fixed to "0" but determined by data inputted through the buffer. As a result, when the read/write control signal at the "L" level is applied to the sense amplifier and writing circuit 6, data "0" is written into a predetermined memory cell.

On the other hand, in the read cycle shown in FIG. 3, the pair of bit lines 20a and 20b are driven by the memory cells 1, so that the level of one of the pair of bit lines 20a and 20b is decreased, as compared with the others thereof. The level of the pair of bit lines 20a and 20b is transmitted from the selected transfer gate 4 to the sense amplifier and write circuit 6 through the I/O lines 22a and 22b. When the read/write control signal is at the "H" level, data is outputted.

Meanwhile, after the static semiconductor memory device is manufactured in a factory, it must be examined before shipment whether or not data "0" or "1" can be written into all of memory cells. In addition, a system employing the static semiconductor memory device having may include a system that all memory cells must be reset when a power supply is recovered after disconnection of the power supply. Furthermore, it may be desired by a user that all of memory cells are reset.

However, as described in the above described operation in the write cycle, memory cells must be sequentially addressed when data "0" or "1" is written into the memory cells. Assuming that a cycle for designating an address of a single memory cell and writing the data "0" or "1" into the memory cell is one cycle, m x n cycles are required to write the data "0" or "1" into all of n memory cells shown in FIG. 1. Assuming that one cycle requires at least 100 nsec in a 256K static RAM, for example, a time period of 256K (1K=1024)×100 nsec÷26.2 msec is required.

SUMMARY OF THE INVENTION

A primary object of the present invention is to provide a static semiconductor memory device having function of resetting stored data which can largely reduce the time period required for collectively setting data in a plurality of semiconductor memory cells so that the speed for testing each memory cell can be increased.

In accordance with an aspect of the present invention, in the static semiconductor memory device having function of resetting stored data comprising a two dimensional memory cell array formed by static memory cells connected to a plurality of complementary bit line pairs and to a plurality of word lines, row decoder means for selecting a specific one of the plurality of word lines, a plurality of bit line load circuit means connected between a power supply and the plurality of bit lines, and an output terminal for outputting data from the memory cells, the static semiconductor memory device further comprising means for simultaneously accessing a plurality of the cells and means for setting cells accessed by the accessing means to a common state.

Therefore, according to the static semiconductor memory device having function of resetting stored data of the present invention, a plurality of cells can be quickly reloaded with the same data without largely changing the conventional circuit structure, so that the rise time can be extremely reduced and the time for testing each memory cell can be reduced in a device comprising memory cells having large capacitance.

In accordance with another aspect of the present invention, ones of the plurality of word lines connected to the predetermined ones of the memory cells are simultaneously activated, currents flowing in the bit line load circuits connected to the predetermined ones of the memory cells are cut off, and the bit line pairs connected to the predetermined ones of the memory cells are fixed to a common state.

Accordingly, a plurality of memory cells connected to a particular pair of bit lines can be set to a common state.

In accordance with still another aspect of the present invention, all of the plurality of word lines connected to the memory cells are simultaneously activated, currents flowing in all of the plurality of bit line pairs and the bit line load circuits are cut off, and the bit line pairs are fixed to a common state, so that common data can be written into all of the memory cells.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 4:
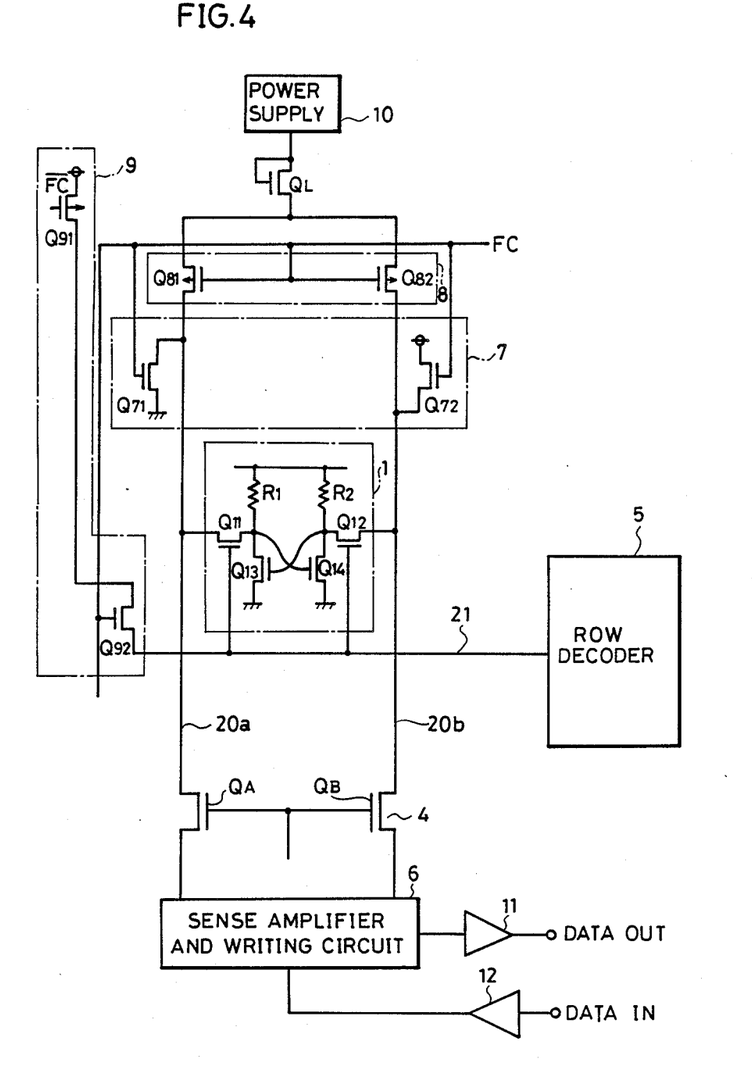
FIG. 4 is a block diagram according to an embodiment of the present invention.
Figure 5:
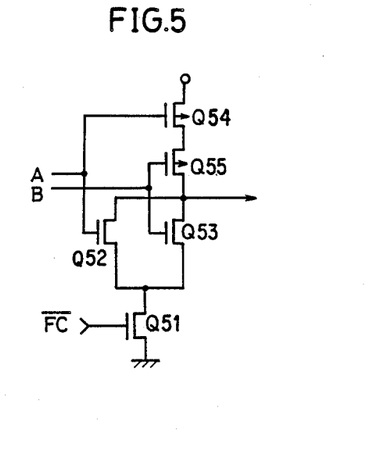
FIG. 5 is a diagram showing a structure of the final stage included in a row decoder shown in FIG. 2.

FIG. 4 is a block diagram according to an embodiment of the present invention, and FIG. 5 is a diagram showing a structure of the final stage included in a row decoder shown in FIG. 4.

Referring now to FIGS. 4 and 5, description is made on a structure according to an embodiment of the present invention. In FIG. 4, a memory cell 1 comprises four n-channel MOSFETs $Q_{11}$, $Q_{12}$, $Q_{13}$ and $Q_{14}$ having resistance $R_1$ and $R_2$ as loads. Each of the MOSFETs $Q_{11}$ and $Q_{12}$ has a gate connected to a word line 21, and a source and a drain. The respective source or drain of the MOSFETs $Q_{11}$ and $Q_{12}$ are connected to complementary bit lines 20a and 20b, respectively. The MOSFETs $Q_{11}$ and $Q_{12}$ are referred to as access transistors and the MOSFETs $Q_{13}$ and $Q_{14}$ are referred to as driver transistors. In the same manner as the aforementioned description of FIG. 1, such memory cells 1 are arranged in a matrix. For simplicity, only a single memory cell is illustrated in FIG. 4.

A word line driving circuit 9 is connected to an end of the word line 21. The word line driving circuit 9 drives a plurality of word lines so that the word lines attain a common level, for example, an "H" level, and comprises MOSFETs $Q_{91}$ and $Q_{92}$.

It should be noted that the word line driving circuit 9 is illustrated in FIG. 4 only by way of example. As a matter of practice, since a plurality of word lines 21 are provided, there are provided the MOSFETs $Q_{92}$, the number of which is identical to the number of the plurality of word lines 21. The MOSFETs $Q_{92}$ has a source connected to one end of the word line 21. The other end of the word line 21 is connected to a row decoder 5. The MOSFET $Q_{92}$ has a drain connected to a drain of the MOSFET $Q_{91}$, and a gate connected to a node $\overline{FC}$.

The MOSFET $Q_{91}$ has a gate connected to a node FC, the signal of which is inverted relative to the signal of the node $\overline{FC}$. The MOSFET $Q_{91}$ has a source connected to a power supply potential.

A potential fixing circuit 7 fixes the bit line 20a to an "L" level and the bit line 20b to the "h" level, and comprises MOSFETs $Q_{71}$ and $Q_{72}$. The MOSFET $Q_{71}$ has a drain connected to the bit line 20a, a source connected to a ground and a gate connected to the node FC. In addition, the n-channel transistor $Q_{72}$ has a source connected to the bit line 20b, a drain connected to a power supply and a gate connected to the node FC.

A cutoff circuit 8 cuts off currents flowing in the bit lines 20a and 20b, and comprises two p-channel MOSFETs $Q_{81}$ and $Q_{82}$. The MOSFET $Q_{81}$ has a source connected to the bit line 20a, and a drain connected to a source of an n-channel load transistor $Q_L$. The MOSFET $Q_{82}$ has a source connected to the bit line 20b and a drain connected to a source of the load transistor $Q_L$. Each of the MOSFETs $Q_{81}$ and $Q_{82}$ has a gate connected to the node FC. The load transistor $Q_L$ has a drain and a gate each connected to a power supply 10.

Although FIG. 4 illustrates only a pair of the complementary bit lines 20a and 20b, a plurality of bit line pairs are provided as a matter of practice, and hence load transistors $Q_L$, current cutoff circuits 8 and potential fixing circuits 7 are provided to be identical in number to the bit line pairs.

Since the word line 21 is driven by either the row decoder 5 or the word line driving circuit 9, an output stage of the row decoder 5 comprises MOSFETs $Q_{51}$ to $Q_{55}$ as shown in FIG. 5, so that the word line 21 is not pulled down.

Figure 6:
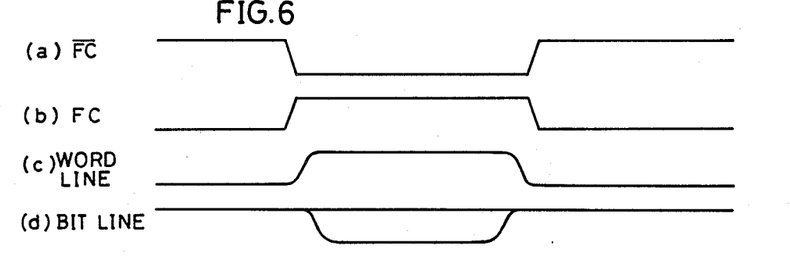
FIG. 6 is a timing chart for explaining operation according to an embodiment of the present invention.

FIG. 6 is a timing chart for explaining operation according to an embodiment of the present invention.

Referring now to FIGS. 4 to 6, description is made on specific operation according to an embodiment of the present invention. According to the present embodiment, when the node FC is set to the "L" level and the node $\overline{FC}$ is set to the "H" level, both the MOSFETs $Q_{91}$ and $Q_{92}$ are rendered non-conductive, so that the word line driving circuit 9 is cut off from the word line 21. In addition, the MOSFETs $Q_{81}$ and $Q_{82}$ are rendered conductive, so that the power supply 10 is connected to the bit lines 20a and 20b through the load transistor $Q_L$. Furthermore, the MOSFETs $Q_{71}$ and $Q_{72}$ are rendered non-conductive, so that the potential fixing circuit 7 is cut off from the bit lines 20a and 20b. The structure is the same as that of the conventional static semiconductor memory device shown in FIG. 1. Thus, so long as the node FC is set to the "L" level and the node $\overline{FC}$ is set to the "H" level, the same operation as those in the write cycle shown in FIG. 2 and the read cycle shown in FIG. 3 is performed in the conventional manner.

Description is now made on operation which is a characteristic of the invention.

When data are written into a plurality of memory cells, the node $\overline{FC}$ is set to the "H" level and the node FC is set to the "L" level, as shown in FIGS. 6(a) and 6(b). When the node $\overline{FC}$ attains the "L" level, the MOSFET $Q_{91}$ is rendered conductive. In addition, when the node FC attains the "H" level, the MOSFET $Q_{92}$ is rendered conductive. Thus, the word line 21 is raised to the "h" level, as shown in FIG. 6(c). Since the node $\overline{FC}$ is at the "L" level, the MOSFET $Q_{51}$ in the final stage of the row decoder 5 shown in FIG. 5 is rendered non-conductive, so that a current path from the row decoder 5 to the word line 21 is cut off and the word line 21 is never pulled down. On the other hand, the MOSFET Q$_{92}$ in the word line driving circuit 9 pulls up the word line 21, so that the potential of the word line 21 is raised to Vcc-V$_{THn}$, where Vcc represents the potential of the power supply 10 and V$_{THn}$ represents the threshold voltage of the MOSFET.

On the other hand, since the node FC is at the "H" level, the MOSFETs Q$_{81}$ and Q$_{82}$ in the current cutoff circuit 8 are rendered non-conductive, so that current flowing in the load transistor Q$_L$ is cut off. Since both the MOSFETs Q$_{71}$ and Q$_{72}$ in the potential fixing circuit 7 are simultaneously rendered conductive, the bit line 20a attains a ground level as shown in FIG. 6(d) and the level of the bit line 20b is raised to Vcc-V$_{THn}$. At that time, since the source and the gate of the access transistor Q$_{11}$ of the memory cell 1 attains the ground level and the level of Vcc-V$_{THn}$ respectively, the access transistor Q$_{11}$ is rendered conductive. Accordingly, the gate of the driver transistor Q$_{14}$ attains the ground level, so that the driver transistor Q$_{14}$ is rendered non-conductive. Thus, the drain of the driver transistor Q$_{13}$ is precharged to be (the level of the word line 21) −V$_{THn}$ through the access transistor Q$_{12}$.

Since the load resistances R$_1$ and R$_2$ of the memory cell 1 are of extremely high resistance in excess of several hundreds GΩ, the effect of precharging of the driver transistor Q$_{13}$ by the resistances R$_1$ and R$_2$ can be neglected. As a result, the gate of the driver transistor Q$_{14}$ attains the ground level and gate of the driver transistor Q$_{13}$ attains the level of Vcc-2V$_{THn}$, so that data "0" is written into the memory cell 1.

Although in the above described embodiment, the drain of the MOSFET Q$_{92}$ is connected to the drain of the MOSFET Q$_{91}$, it is not intended to be limited to the same. The drain of the MOSFET Q$_{92}$ may be connected to the power supply potential Vcc.

Furthermore, although in the above described embodiment, the "H" level of the word line 21 is at Vcc-V$_{THn}$, the same may be at Vcc, as far as the level of the word line 21 is larger than the level of the V$_{THn}$ of the MOSFET Q$_{13}$.

Additionally, although in the above described embodiment, the data "0" is written into all of the memory cells, data "1" may be written into all of the memory cells. In addition, either data "0" or "1" may be written into only the memory cell connected to the same bit line. In this case, it is necessary to fix only the bit line connected to the memory cell to which data is to be written, to a predetermined potential by the potential fixing circuit 7.

Figure 7:
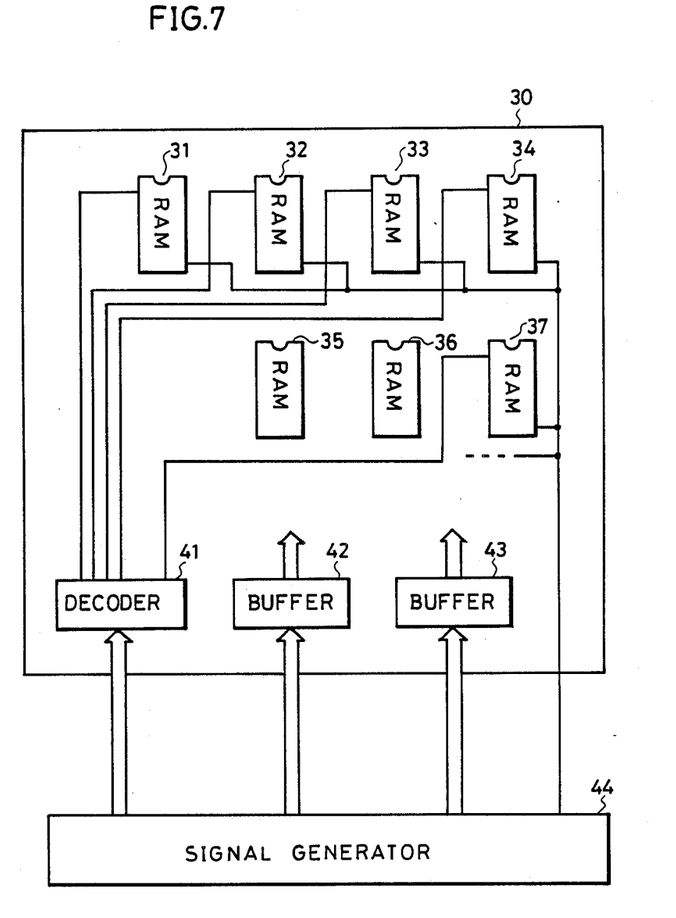
FIG. 7 is a diagram showing a board having an arrangement of the static semiconductor memory device according to the present invention.
Figure 8:
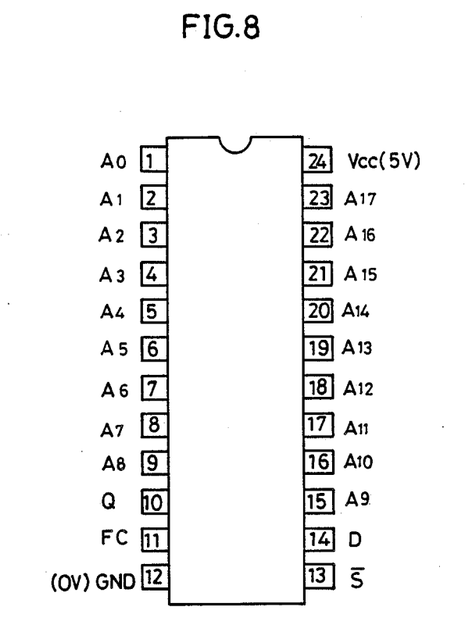
FIG. 8 is a diagram showing a package structure containing the static semiconductor memory device according to the present invention.

FIG. 7 is a diagram showing an example of a board having an arrangement comprising the static semiconductor memory cells according to the present invention, and FIG. 8 is a diagram showing a package in which the static semiconductor memory device according to the present invention is packaged.

In FIG. 7, many static RAMs 31 to 37 according to the present invention, a decoder 41, and buffers 42 and 43 are arranged on a board 30. An address signal for designating any of the RAMs on the board 30 from a signal generator 44 is applied to the decoder 41. The decoder 41 decodes the address signal and outputs a chip selecting signal for selecting any of the RAMs. In addition, when an address signal is applied to the buffer 42 from the signal generator 44, the buffer 42 stores the address signal, so that the RAMs 31 to 37 are addressed by an output of the buffer 42. When a control signal is applied to the buffer 43 from the signal generator 44, the buffer 43 stores the control signal, so that writing and reading of each of the RAMs are controlled by an output of the buffer 43. Furthermore, when an FC signal is applied to an FC terminal of each of the RAMs from the signal generator 44, data are collectively written into each of the RAMs 31 to 37 by the FC signal.

As described in the foregoing, according to the present invention, a plurality of static memory cells can be simultaneously accessed to enter a common state. Therefore, before a static semiconductor memory device is shipped from a factory, it can be examined in a short time period whether or not data "0" or "1" can be written into all of memory cells. Furthermore, all of the memory cells can be collectively reset in a quick manner when a user desire to do so, and also all of the memory cells can be easily reset when a power supply is recovered to a predetermined state after disconnection of the power supply.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. In a static semiconductor memory device comprising a two dimensional memory cell array formed by static memory cells connected to a plurality of complementary bit line pairs and to a plurality of word lines, row decoder means for selecting a specific one of said word lines from among said plurality of word lines, a plurality of bit line load circuit means connected between said plurality of bit lines pairs and a power supply source, and an output terminal connected to said bit line pairs for outputting data from said memory cells, said static semiconductor memory device comprising:
    word line driving means for simultaneously activating ones of said plurality of word lines connected to predetermined ones of said memory cells;
    cutoff circuit means connected between said bit line load circuit and ones of said plurality of bit line pairs connected to said predetermined ones of said memory cells for interrupting a current flow in said bit line load circuits connected to said predetermined ones of said memory cells; and
    potential fixing circuit means for setting said bit line pairs connected to said predetermined ones of said memory cells to a common state.

2. The static semiconductor memory device in accordance with claim 1, wherein
    each of said memory cells is formed by:
    first and second n-channel MOSFETs having drains and gates cross-connected with each other and sources connected to grounding conductors,
    a third n-channel MOSFET having a source, a drain and a gate connected to said drain of said first n-channel MOSFET, said bit line and said word line respectively,
    a fourth n-channel MOSFET having a source, a drain and a gate connected to said drain of said second n-channel MOSFET, said bit line and said word line respectively,
    a first resistor connected between a power supply and said drain of said first n-channel MOSFET, and
    a second resistor connected between a power supply and said drain of said second n-channel MOSFET.

3. The apparatus of claim 1, further including signal generating means for generating address signals for addressing particular ones of said memory cells and a control signal for controlling said word line driving means, said cutoff circuit means and said potential fixing means.

4. The apparatus of claim 1, wherein said memory cells are formed of MOSFETs, and said word line driving means includes MOSFET output means, said word line driving means generating selectively an output signal having a level equal to Vcc-Vth, wherein Vcc is the potential of said supply voltage source and Vth is threshold voltage of said MOSFET output means.

5. The apparatus of claim 4, further including signal generator means for generating (a) address signals for addressing particular ones of said memory cells and (b) a control signal for controlling said word line driving means, said cutoff circuit means and said potential fixing means.

6. The apparatus of claim 5, wherein said memory cell array comprises a plurality of interconnected memory cell arrays respectively arranged on separate chips, said control signal being applied simultaneously to said plurality of interconnected memory cell arrays.

7. In a static semiconductor memory device comprising a two dimensional memory cell array formed by static memory cells connected to a plurality of complementary bit line pairs and to a plurality of word lines, row decoder means for selecting a specific one of said word lines from among said plurality of word lines, a plurality of bit line load circuit means connected between said plurality of bit line pairs and a power supply source, and an output terminal connected to said bit line pairs for outputting data from said memory cells, said static semiconductor memory device comprising:

word line driving means for simultaneously activating all of said plurality of word lines connected to said memory cells;

cutoff circuit means connected between said bit line load circuit means and all of said plurality of bit line pairs connected to said memory cells for interrupting a current flow in all of said bit line load circuits; and potential fixing circuit means for setting said bit line pairs connected to all of said memory cells to a common state.

8. In a static semiconductor memory device comprising a two dimensional memory cell array formed by static memory cells connected to a plurality of complementary bit line pairs and to a plurality of word lines, row decoder means for selecting a specific one of said word lines from among said plurality of word lines, a plurality of bit line load circuit means connected between said plurality of bit line pairs and a power supply source, and an output terminal connected to said plurality of bit lines for outputting data from said memory cells, a method of simultaneously accessing a predetermined plurality of said memory cells to store a common state therein, comprising the steps of:

simultaneously activating ones of said plurality of word lines connected to said predetermined one of said memory cells;

interrupting a current flow in particular ones of said bit line load circuits connected to said predetermined ones of said memory cells; and setting said bit line pairs connected to said predetermined ones of said memory cells to a common state.

9. A static semiconductor memory device comprising:

a plurality of complementary bit line pairs;

a plurality of word lines;

a two dimensional memory cell array formed by static memory cells connected to said plurality of complementary bit line pairs and to said plurality of word lines;

row decoder means for selecting a specific one of said word lines from among said plurality of word lines in response to an address signal;

a plurality of bit line load circuit means connected between said plurality of bit line pairs and a power supply source;

means for receiving a control signal;

cutoff circuit means connected between said bit line load circuit means and said plurality of bit line pairs for interrupting a current flow in all of said bit line load circuits in response to said control signal;

word line driving means for simultaneously activating all of said plurality of word lines connected to aid memory cells in response to said control signal;

word line presetting means for applying first and second signals to respective ones of complementary bit line pairs in response to said control signal; and data output means connected to said plurality of complementary bit line pairs for outputting data stored in said static memory cells connected to said selected one of said word lines.

10. The apparatus of claim 9, wherein said row decoder means is disabled responsive to said control signal.

11. The apparatus of claim 9, wherein each of said memory cells comprises:

first and second MOSFETs having drains and gates cross-connected with each of other and sources connected to a ground potential;

a third MOSFET having a source, a drain and a gate connected to said drain of said first MOSFET, said bit line and said word line, respectively;

a fourth MOSFET having a source, a drain and a gate connected to said drain of said second MOSFET, said bit line and said word line, respectively;

a first resistor connected between a power source and said drain of said first MOSFET; and a second resistor connected between said power source and said drain of said second MOSFET.

12. A static semiconductor memory device operable in random access and reset modes of operation, comprising:

a plurality of static memory cells arranged in a matrix of rows and columns;

a plurality of word lines arranged in rows, each word line being connected to static memory cells arranged in a corresponding one of said rows of said matrix of rows and columns;

a plurality of bit line pairs arranged in columns, each bit line pair connected to a one of said static memory cells in a corresponding one of said columns of said matrix of rows and columns;

means for receiving an operating mode signal for selecting said random access and reset operating modes of said memory;

row decoder means operable for selecting one of said word lines from said plurality of word lines when said memory is in said random access mode of operation;

a plurality of cutoff circuit switch means arranged in columns, each cutoff means connected between a power supply node and one of said bit line pairs of a corresponding column and (a) electrically connecting said supply node and said one bit line pair when said memory is in said random access mode of operation and (b) electrically isolating said power supply node from said one bit line pair when said memory is in said reset mode of operation;

word line driving means for setting said plurality of word lines to an enable state when said memory is in said reset mode of operation; and a plurality of potential fixing means arranged in columns, each of said potential fixing means setting one of the bit lines of a bit line pair of a corresponding column to a high potential level and the other bit line to a low potential level when said memory is in said reset mode of operation.

13. The apparatus of claim 12, wherein each of said cutoff circuit switch means comprises:

a MOS transistor connected between said power supply node and one of the bit lines of a bit line pair of a corresponding column; and a MOS transistor connected between said power supply node and the other bit line of said bit line of said corresponding column, a control signal being applied to gate electrodes of both MOS transistors for setting the transistors to a conductive state when said memory is operated in said random access mode and for setting said transistors to a non-conductive state when said memory is operated in said rest mode.

14. The apparatus of claim 12, wherein said word line driving means comprises as plurality of MOS transistors arranged in rows, each of said MOS transistors connected between said power supply node and one of said word lines in a corresponding row, a gate of each of said MOS transistors having applied thereto said operating mode control signal for setting each of said MOS transistors to a non-conductive state when said memory is operated in said random access mode and setting each of said said MOS transistors to a conductive state when said memory is operated in said reset mode.

15. The apparatus of claim 12, wherein each of said potential fixing means comprises (a) a first MOS transistor connected between one bit line of a bit line pair of a corresponding column and a ground potential node and (b) a second MOS transistor connected between the other bit line of said bit line pair of the corresponding column and a voltage supply node, a gate of each of said MOS transistors receiving said operating mode control signal for setting each of said MOS transistors to a non-conductive state when said memory is operated in said random access mode and setting each of said MOS transistors to a conductive state when said memory is operated in said reset mode.

* * * * *